US008223151B2

(12) United States Patent
Rule et al.

(10) Patent No.: US 8,223,151 B2
(45) Date of Patent: *Jul. 17, 2012

(54) MARK EXTENSION FOR ANALYSIS OF LONG RECORD LENGTH DATA

(75) Inventors: Keith D. Rule, Beaverton, OR (US); Thomas L. Freeman, Beaverton, OR (US); Daniel E. Taylor, Beaverton, OR (US); Timothy D. Margeson, Vancouver, WA (US); Scott R. Ketterer, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 945 days.

This patent is subject to a terminal disclaimer.

(21) Appl. No.: 12/019,833

(22) Filed: Jan. 25, 2008

(65) Prior Publication Data

US 2009/0192740 A1 Jul. 30, 2009

(51) Int. Cl.
*G06T 11/20* (2006.01)
(52) U.S. Cl. .......................................... 345/440; 345/441
(58) Field of Classification Search .................. 345/440, 345/441
See application file for complete search history.

(56) References Cited

U.S. PATENT DOCUMENTS

| | | | | |
|---|---|---|---|---|
| 4,072,851 A * | 2/1978 | Rose | ............................. | 702/68 |
| 4,812,996 A * | 3/1989 | Stubbs | ........................... | 702/123 |
| 5,083,571 A * | 1/1992 | Prichep | ........................... | 600/544 |
| 5,222,028 A * | 6/1993 | LaBarre et al. | ................ | 702/73 |
| 5,383,035 A * | 1/1995 | Suzuki | ............................ | 358/500 |
| 5,724,985 A * | 3/1998 | Snell et al. | .................... | 600/510 |
| 5,790,133 A * | 8/1998 | Holcomb et al. | ............ | 345/501 |
| 6,261,103 B1 * | 7/2001 | Stephens et al. | ............... | 434/276 |
| 6,502,045 B1 * | 12/2002 | Biagiotti | ........................... | 702/66 |
| 6,567,760 B1 * | 5/2003 | Kikuchi et al. | .................. | 702/67 |
| 7,010,483 B2 * | 3/2006 | Rajan | ............................. | 704/228 |
| 7,110,864 B2 * | 9/2006 | Restrepo et al. | .............. | 700/293 |
| 7,214,868 B2 * | 5/2007 | Abe et al. | ......................... | 84/600 |
| 7,246,014 B2 * | 7/2007 | Forth et al. | ....................... | 702/60 |
| 7,421,421 B2 * | 9/2008 | Newbold et al. | ...................... | 1/1 |
| 7,463,037 B2 * | 12/2008 | Henson et al. | ................. | 324/536 |
| 7,474,840 B2 * | 1/2009 | Kato et al. | ..................... | 386/248 |
| 7,801,671 B1 * | 9/2010 | Pederson et al. | .............. | 701/111 |
| 2002/0030683 A1 * | 3/2002 | Alexander | ................. | 345/440.1 |
| 2002/0149602 A1 * | 10/2002 | Redpath et al. | ............... | 345/629 |
| 2004/0243540 A1 * | 12/2004 | Moskowitz et al. | ............ | 707/1 |
| 2005/0075825 A1 * | 4/2005 | Zheng et al. | .................. | 702/140 |
| 2006/0001666 A1 * | 1/2006 | Cake et al. | ..................... | 345/440 |
| 2006/0233195 A1 * | 10/2006 | Kato | ............. | 370/466 |
| 2007/0038397 A1 * | 2/2007 | Rule et al. | ....................... | 702/68 |
| 2007/0140662 A1 * | 6/2007 | Nunomaki | ..................... | 386/107 |
| 2008/0037950 A1 * | 2/2008 | Ono et al. | ........................ | 386/68 |

(Continued)

*Primary Examiner* — Javid A Amini
(74) *Attorney, Agent, or Firm* — Thomas F. Lenihan; Francis I. Gray

(57) ABSTRACT

A method of analysis of long record length data using mark duration includes displaying together with a portion of the long record length data each mark that identifies a specified feature of interest together with the mark duration. Associated with the mark may be text identifying the feature of interest, measurement values associated with the duration of the mark, or a combination thereof. Multiple sets of marks may be generated for the long record length data, which sets may be combined to generate new marks with duration. The marks also may be filtered to further refine the marks to be displayed according to user specified criteria. In this way analysis of long record length data representing an acquired signal may be readily automated so a user may move from one interesting event to another without having to pan through the long record length data.

15 Claims, 8 Drawing Sheets

U.S. PATENT DOCUMENTS

| | | | |
|---|---|---|---|
| 2008/0064968 A1* | 3/2008 | Martin et al. | 600/493 |
| 2008/0109729 A1* | 5/2008 | Notea et al. | 715/722 |
| 2009/0034940 A1* | 2/2009 | Hamada et al. | 386/126 |
| 2009/0300528 A1* | 12/2009 | Stambaugh | 715/764 |
| 2010/0080534 A1* | 4/2010 | Kato et al. | 386/95 |

* cited by examiner

MARK EXTENSION FOR ANALYSIS OF LONG RECORD LENGTH DATA

FIELD OF THE INVENTION

The present invention relates to processing of long record length data acquired by a test and measurement instrument, and more particularly to mark extension using duration for analysis of the long record length data.

BACKGROUND OF THE INVENTION

As technology for test and measurement instruments advances, longer record lengths have become available for storing data representing an acquired digitized signal. Because of such long record lengths, it is impractical for a user to manually examine the data representing the acquired digitized signal for interesting events. A user may zoom in on the data in one area of the long record length data using a zoom window to see interesting events in sufficient detail, but due to the long record length it takes the user an unacceptable amount of time to pan the zoom window across the long record length data in order to search for the interesting events. The user may zoom out the zoom window so that panning across the long record length data may be performed in an acceptable amount of time, but the level of detail is so reduced that the user may not see the interesting events. Also positions of the zoom window used for panning may be manually entered, but the user is required to manually record the position of the interesting event and then manually enter the position to return to the interesting event.

To make it easier for the user to examine long record length data, a method of creating marks to identify interesting events in the acquired digitized signal is described in co-pending U.S. patent application Ser. No. 11/498,406, incorporated herein by reference and assigned to the assignee of the present invention, which was filed Aug. 2, 2006, entitled "User-Placed Marks in a Long Record Length Waveform". The user specifies an interesting event to be searched for in the long record length data representing the acquired digitized signal, and a mark is associated with the long record length data at each location where the interesting event is found. The mark may appear on the display within a zoom window together with the displayed portion of the data from the long record length data surrounding the associated interesting event. The user may now navigate from one mark to the next to examine each interesting event without having to pan through the entire long record length data. However, although the mark has duration due to the definition of the feature used to identify the mark, the described implementation does not deal with visualization of the duration for the mark or allow the duration to be used for further analysis. In order to make a measurement the user has to manually position cursors to identify the points within the long record length data between which the measurement is to be made.

Therefore what is desired is a method of making use of the mark duration for assisting with further analysis of the long record length data.

SUMMARY OF THE INVENTION

According the present invention provides for further analysis of long record length data representing an acquired digitized signal by using a mark extent or duration. Once acquired, the long record length data is searched using specified parameters to find interesting events. A mark, having a start location within the long record length data, a duration, a focus and optional information, is generated for each interesting event. The mark is stored, together with associated source data from the long record length data if measurements are to be performed. The source data is processed according to mathematical algorithms, decoding algorithms and the like, and the results are also stored with the mark. The mark is displayed within a zoom window with indicia indicating its duration together with a portion of the long record length data that includes the associated source data, if required. Also displayed with the mark may be alphanumeric information representing measurement values, decoded values, or other identifiers. For more detailed analysis marks may be combined or filtered to form new marks to provide automated measurements. The marks may also be used based upon the values associated with the duration to generate histograms, trend plots, etc. Using the marks with duration allows for more complex analysis of the long record length data than currently available.

The objects, advantages and other novel features of the present invention are apparent from the following detailed description when read in conjunction with the appended claims and attached drawing figures.

DETAILED DESCRIPTION OF THE DRAWING

Figure 1:
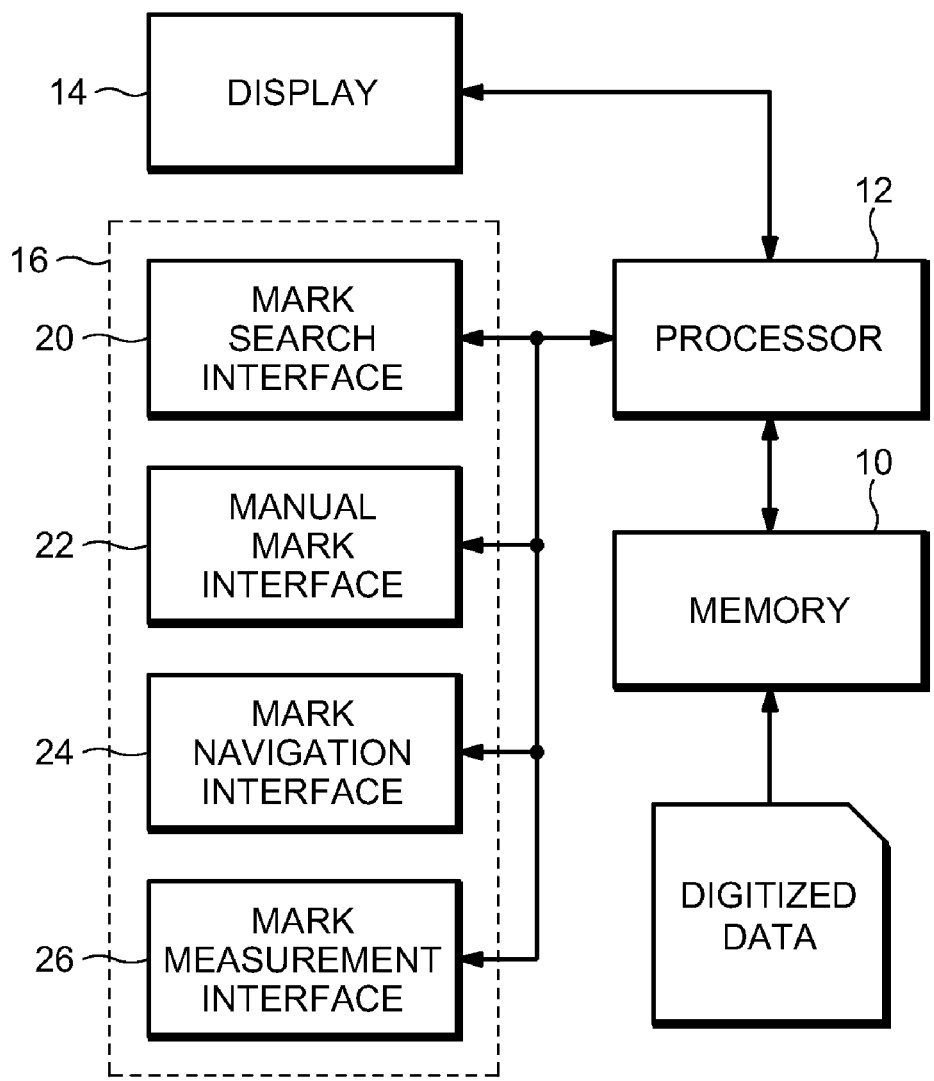
FIG. 1 is a block diagram view of a test and measurement instrument using mark extension for analysis of long record length data according to the present invention.

Referring now to FIG. 1 a memory 10 stores an acquired digitized signal 18 in the form of long record length data. A processor 12 accesses the long record length data for output on a display 14 according to inputs by a user via a conventional user interface (not shown). The processor 12 also interacts with a mark interface 16 to identify interesting events within the long record length data. The resulting marks are then stored in the memory 10 and associated with the positions within the long record length data where the interesting events occurred. The mark interface 16 includes modules (i) for mark search 20 to automatically identify interesting events according to parameters defining the feature of interest specified by the user, (ii) for manual marks 22 where the user manually specifies a mark location within the long record length data, (iii) for mark navigation 24 to allow the user to jump within the long record length data from one mark position to the next, and (iv) for mark measurement 26 which calculates user specified values of the acquired digitized signal associated with each mark.

Each mark contains the following information: (i) start location; (ii) duration (extent); (iii) focus; and (iv) optional fields. The start location denotes the position of the beginning of the mark along a horizontal axis within the long record length data. For waveform displays the horizontal axis generally represents "time", for spectral displays the horizontal axis generally represents "frequency", etc. The duration denotes a length in horizontal units within the long record length data from the start location to an end location, i.e., end location is simply the start location+duration. Alternatively, rather than specifying duration, the end location may be identified so that duration=end location−start location. The focus is a location of interest within the mark. The optional fields may include information for generating annotations, as discussed below, or may be used in subsequent searches or for further analysis.

Figure 2:
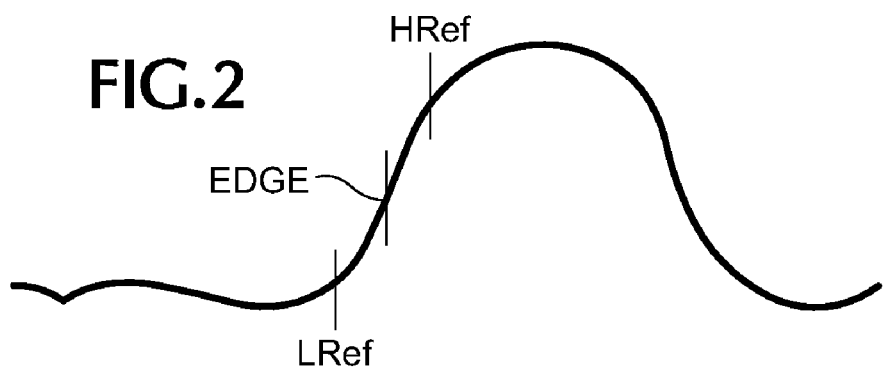
FIG. 2 is a graphic diagram view of a waveform illustrating mark generation according to the present invention.

As an example, as shown in FIG. 2 using a waveform signal, a rise time calculation is shown. The start of the rise time measurement is found by the processor 12 at LRef, and the end of the measurement is found at HRef. However the Edge may be the interesting event and hence be the focus. Therefore the processor 12 locates the mark at the position within the long record length data that corresponds to the zero crossing that occurs between LRef and HRef. The duration associated with the mark may be the horizontal distance between LRef and Href. What is stored for the mark are the start location within the long record length data corresponding to LRef, the duration (LRef−HRef) and the focus (Edge). Alternatively the focus may simply be the location for centering the mark when moving to the next or previous mark location, which may simply be the mid-point between the start location and end location. Whether the focus is the interesting event or an arbitrary location specified by the user for better navigation along the long record length data is discretionary to the user. The mark indicator on the display 14 may be just a single triangle, for example, at the focus of the interesting event, or may be a pair of triangles occurring at the start and end locations with a connecting bar indicating duration. Indicia other than triangles may be used for the mark indicator. The indicia may be used to indicate the source of the mark—manually inserted, normal search result or compliance violations.

Figure 3:
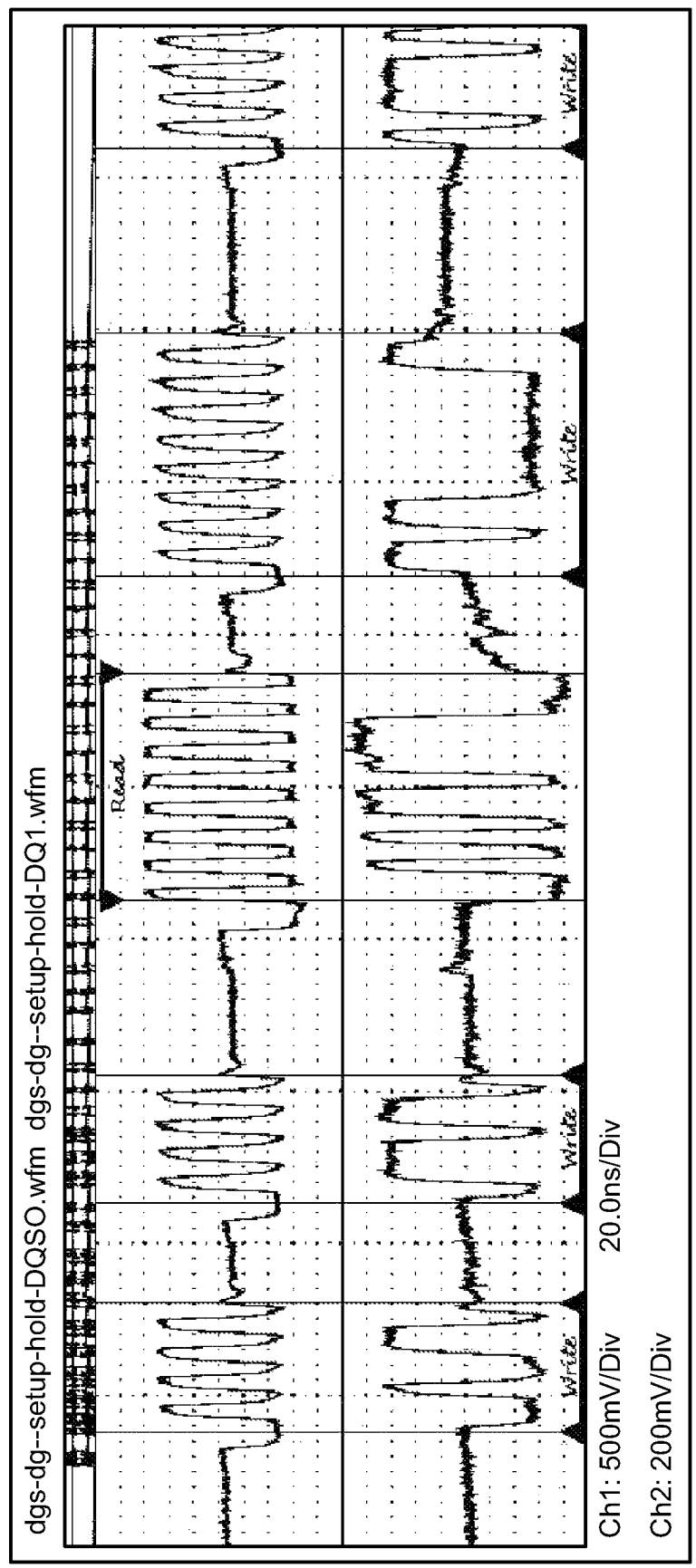
FIG. 3 is a plan view of a waveform display illustrating the display of marks with duration according to the present invention.

FIG. 3 shows a waveform display where the marks are shown visually with duration so that the extent of the marks is apparent. The marks have specific begin and end locations indicated by the respective triangles with a connecting bar to indicate the duration. The marks may be located either above or below the corresponding waveform, and also may be annotated to indicate a measurement or event encompassed by the mark. In the display shown, the entire long record length data for both displayed channels are displayed at the top of the display screen above zoomed waveform displays from each of the two channels. It is apparent that viewing of the entire long record length data masks interesting events. A user specifies the interesting events to be marked by inputting parameters via the mark interface 16 to the processor 12. Such criteria may include looking for portions of the acquired digitized signal that have compliance violations, such as having a rise time less than or greater than a specified rise time, for example. In this example the processor 12 examines the long record length data for rise times by finding LRef and HRef for each edge which determines a rise time duration for each rising edge mark, and compares the duration of each such mark with the specified rise time parameters. If the rise time does not meet the defined parameters, no mark is generated for display and the processor 12 moves to the next identified edge within the long record length data. However if the rise time meets the defined parameters, the mark is generated for display together with the duration measurement value. The mark has an associated position that corresponds to the location of the interesting event within the long record length data and is stored in the memory 10. For this example the mark so generated includes the start location and duration of the rise time, and is displayed either as a single mark at the focus or with a start indicator and a stop indicator with a bar connecting the two to show the extent or duration of the mark. For measurement purposes source data from the long record length data that fall within the locations defined by the mark start location and duration may also be stored with the mark.

FIG. 3 illustrates a pair of digital signals from respective input channels, one representing read and write strobes for a processor and the other representing binary data. The criteria entered define what decoded data from the long record length data defines a read instruction and what decoded data from the long record length data defines a write instruction. The processor 12 decodes the long record length data into binary bits, and looks for patterns corresponding to the read and write instructions in the command channels. The processor 12 generates two sets of marks, one for the read commands and the other for the write commands, and displays them separately. In this illustration the read marks are displayed at the top of the zoom window and the write marks are displayed at the bottom of the zoom window. The data being written or read is displayed in the lower data channel and the associated read/write strobes are displayed in the upper channel. It is visually apparent what binary data is being read or written during the respective mark durations. The annotation indicates visually what each mark represents—either a read or write interval.

Figure 4:
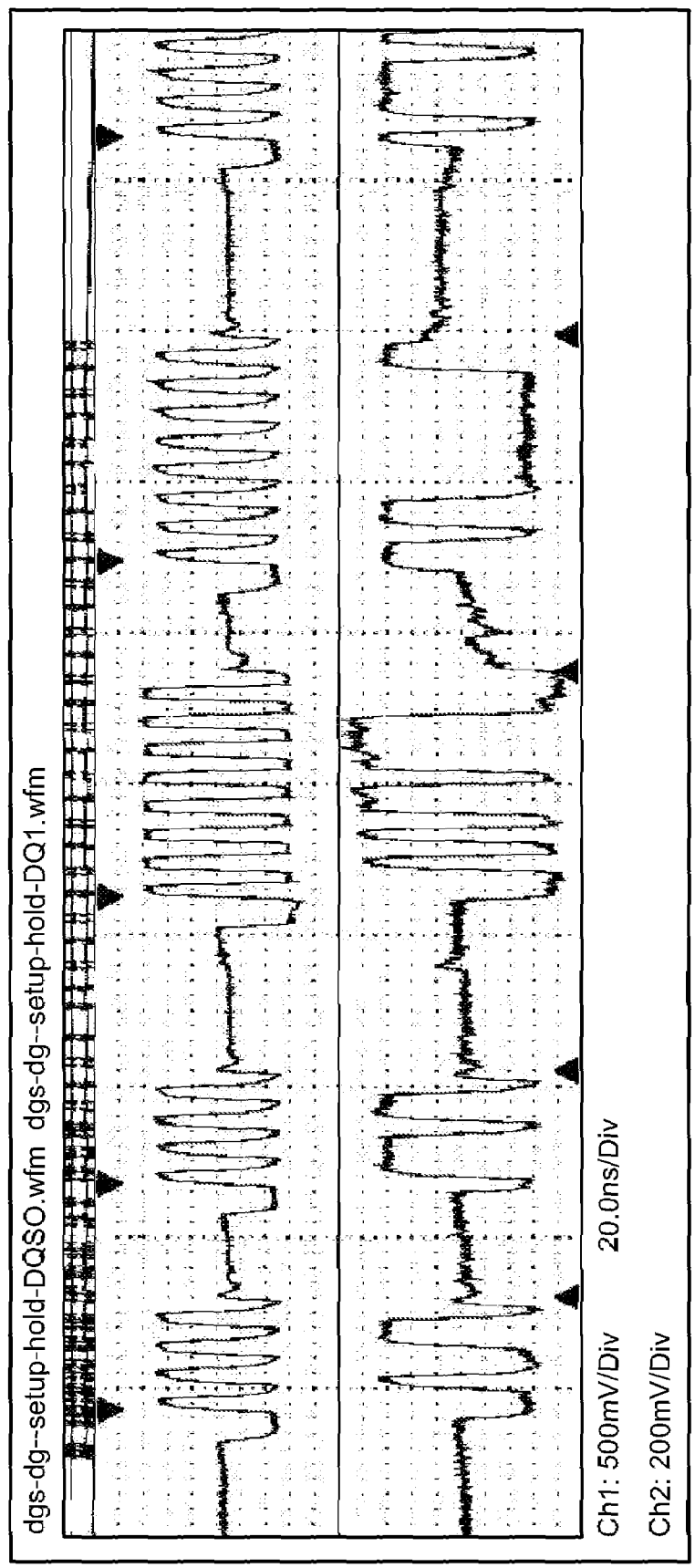
FIG. 4 is a plan view of a waveform display illustrating display of different sets of marks according to the present invention.
Figure 5:
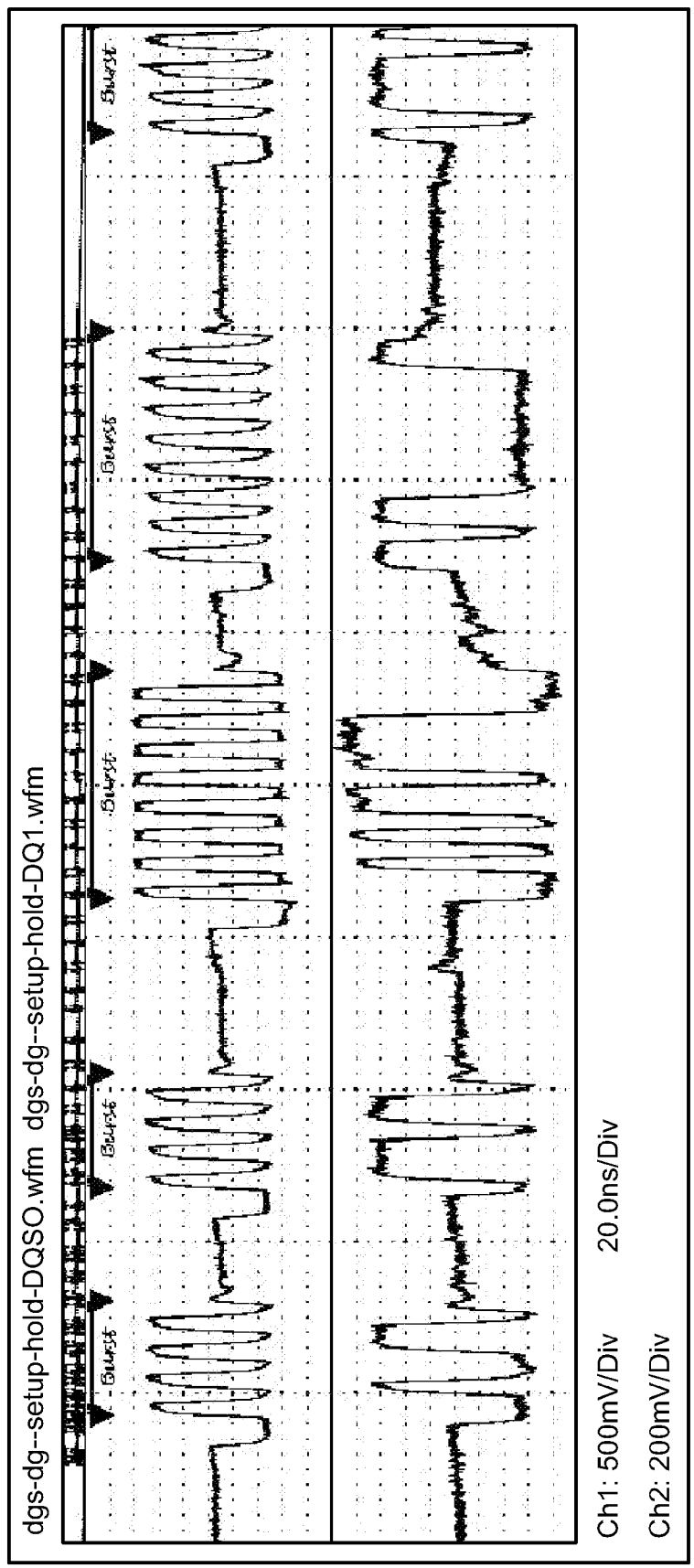
FIG. 5 is a plan view of a waveform display illustrating the combining of the sets of marks of FIG. 4 according to the present invention.

Combining two marks to form a new mark having extent or duration is often very useful. FIG. 4 shows that two separate sets of marks may be constructed to identify the beginnings and ends of burst sequences. These marks are displayed at the respective focus positions. However the individual marks do not represent the burst itself. Therefore to build a new mark with extent one set of marks is defined as being the start location of the new mark and the other set of marks is defined as being the end location. Only a single horizontal position value is associated with the start or end location of a mark. Therefore when a mark is specified as the source for the start/end of the new mark, the start/focus/duration (end) needs to be specified as the criteria for the new mark.

The algorithm for determining the correct pair of marks to combine to form the new mark may be like the following:

```
begin_marks[ ] = marks1;   /*set of mark values associated w/start
                             of new mark*/
end-marks[ ] = marks2;     /*set of mark values associated w/end of
                             new mark*/
//Build up new mark array
foreach (begin_time in begin_marks)
{
    //Find value in end marks array immediately following begin_time
    end_time = FindNext(end_marks, begin_time);
    //Create the new mark with begin location = begin_time,
    //end location = end_time, and
    //focus = (end_time − begin_time)/2 + begin_time
```

-continued

```
    marks.Add(newMark(begin_time, end_time,
        (End_time - begin_time)/2 + begin_time);
}
```

Figure 6:
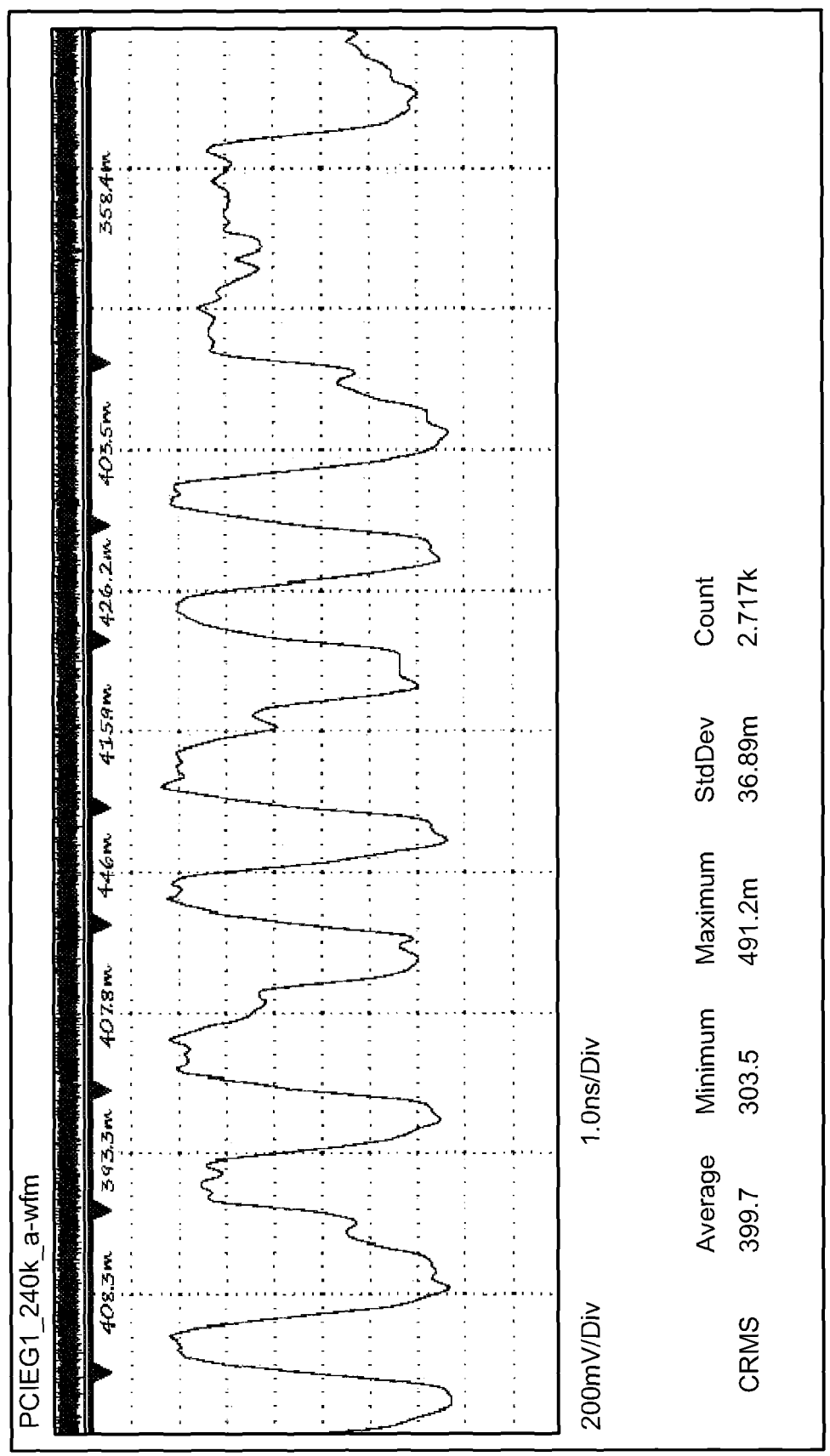
FIG. 6 is a plan view of a waveform display illustrating the use of marks for making measurements according to the present invention.

The above-mentioned pending U.S. patent application Ser. No. 11/498,406 describes using measurements to create marks. The present invention does the inverse—it uses marks to make measurements. FIG. 6 shows marks with an RMS measurement gated by the extent of the mark. In this example each mark is simply the rising edge to rising edge cycle, which is the combination of respective edge marks that are placed at the edge focus for each cycle, with the end of one mark being the start for the next mark. Attached to the cycle mark is a simple mathematical expression, such as sqrt(integrate(begin, end, ch1^2))/width where begin and end define the range of locations within the long record length data for performing the integration function. This expression calculates RMS values from the long record length data that are associated with the corresponding mark. Implicit in the expression is the extent of each measurement. This means that width simply defines the extent of the mark and that integrate is calculated over the range starting at the beginning position of the mark within the long record length data and finishing at the end of the mark within the long record length data. This example may be generalized to support a large range of mathematical operations.

Figure 7:
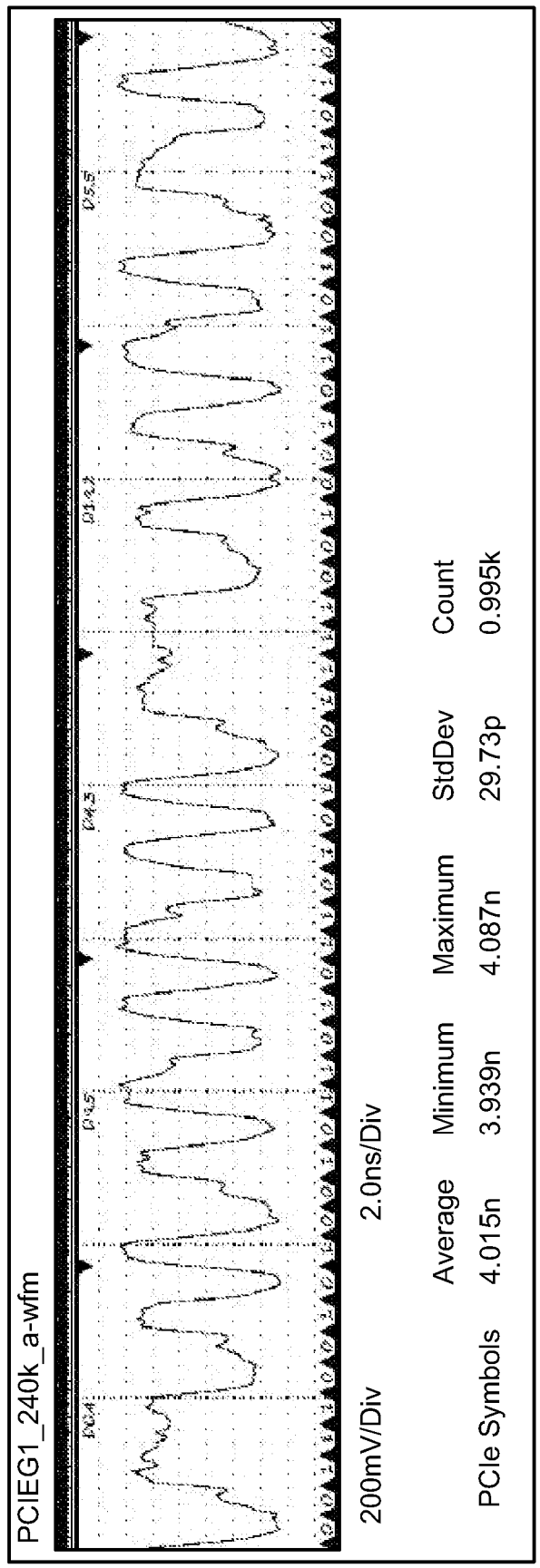
FIG. 7 is a plan view of a waveform display of a digital signal using different sets of marks annotated to show decoded values and bit values according to the present invention.
Figure 8:
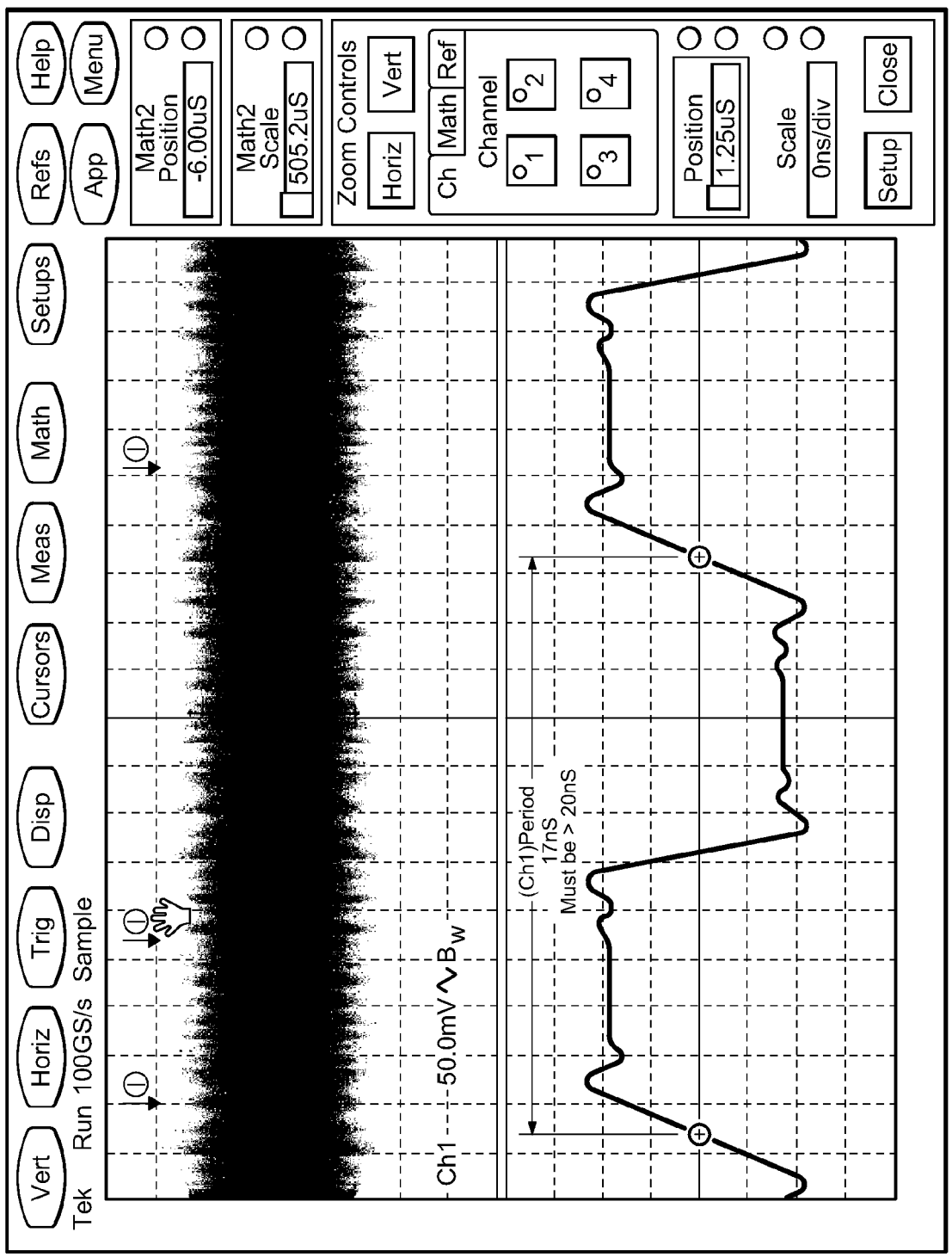
FIG. 8 is a plan view of a waveform display of long record length data annotated as to source and to show compliance criteria according to the present invention.

As indicated above it is often desirable to associate text with marks. Text may be displayed with the mark as shown in FIGS. 3 and 6 provided enough space is available on the display. The annotation may include math results where the results of a measurement associated with specific marks are formatted and displayed. Serial data and parallel data buses may have several possible representations, either derived symbols such as the 8b10b symbols shown at the top in FIG. 7 using a first set of marks representing decoded data words or the underlying data such as the data bits shown at the bottom using a second set of marks that define each bit duration. Also it's useful to allow the formatting definition to be associated with the mark definition. For example a format string, such as "% v" may be used to represent the math result value, which the user may augment to "% v RMS" to show the value with the suffix "RMS." Further types of marks may be annotated when several types are displayed on the display screen. FIG. 2 shows the string "Read" associated with one set of marks and the string "Write" associated with the other set of marks. Also as shown in FIG. 8 the annotation associated with the mark may include source notation "(Ch1)Period" as well as compliance criteria "!Must be > 20 ns" together with the actual measurement value "17 ns."

The marks may themselves be processed as data to produce histograms, trend plots and plots that may be saved. For example histograms based on the marks may indicate variations in pulse width values or rise times, or may show trends in how pulse widths change or frequencies change, etc.

An entire set of marks has many types of configurable items, such as color of the set, vertical location, decorations (changing color of waveform region associated with the mark region, drawing boxes, lines or other visual information other than text), format string (described above), name and enabled (whether marks are to be displayed or not).

Every set of marks may be viewed as a population of results in a mark table. Because of that it is possible to further filter the marks according to different criteria or to calculate various statistical values, such as average, minimum, maximum, standard deviation and count for the measurement results as shown in FIG. 7. By default if no measurement result is associated with the mark, the result used for the mark summary is the width value in horizontal units within the long record length data.

Currently a large number of measurements and analyses may be qualified by a pair of cursors manually positioned by a user defining a starting point and duration. The mark having duration may be used automatically in the same manner. To automate the calculation for many types of analyses, each mark may be treated in the same way that current analysis applications are gated by cursors or other types of qualifiers.

Figure 9:
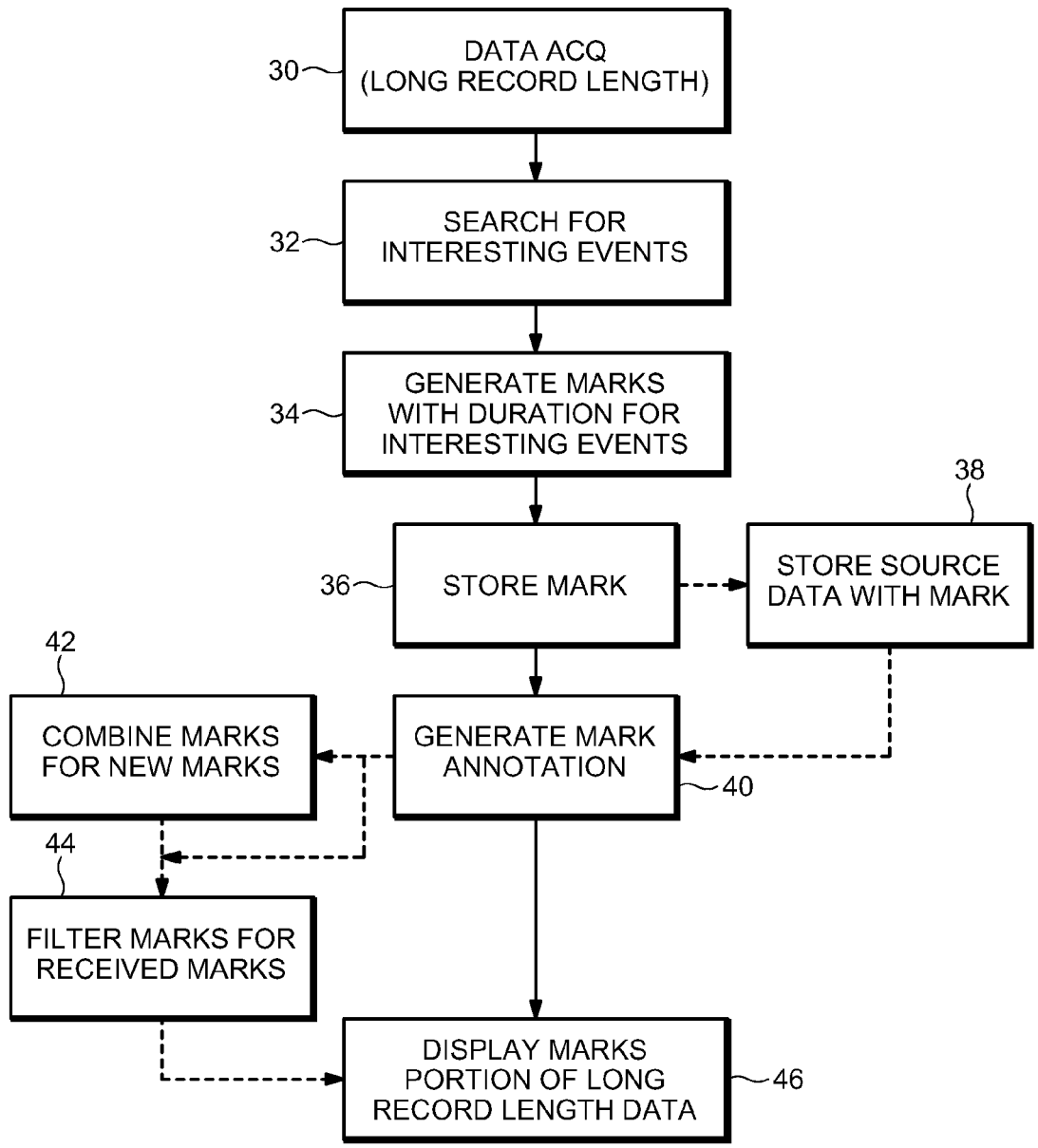
FIG. 9 is a flow chart view of the method of using marks with duration for analysis of long record length data according to the present invention.

Referring now to FIG. 9 the method in step 30 acquires for each input channel of the test and measurement instrument a digitized signal that is represented by long record length data in memory 10. At the conclusion of the acquisition process, the processor 12 searches (step 32) the long record length data for the interesting events defined by the user. For each identified interesting event a mark is generated (step 34) that includes start position within the long record length data, focus and duration. The mark is stored (step 36) together with corresponding source data (step 38) from the long record length data. Annotations for the mark are generated (step 40) according to measurement results and/or text strings provided by user input or generated as decoded symbology for the source data. The measurement results are generated by mathematical formulations associated with the mark from the associated source data. Marks may be combined (step 42) to generate new marks with new measurement results and/or text strings. The marks may be further filtered by analyzing the measurement results (step 44) to produce a refined set of marks. The resulting marks may be displayed (step 46), if enabled, together with the corresponding portion of the long record length data. The properties of the marks and/or of the associated displayed portion of the long record length data may be specified by the user to further indicate the corresponding interesting event on the display 14. Also statistical data from the mathematical results for a set of marks may be calculated for display as well.

Thus the present invention provides a mark extension that uses duration for visual display as well as for automatically performing mathematical functions to obtain measurement results and/or for decoding the long record length data into human readable form. Complex filtering functions may be applied to the resulting measurement results to refine the marks for display.

What is claimed is:
1. A method of analysis of long record length data acquired by a test and measurement instrument, said long record length data representing an acquired input signal using marks, comprising the steps of:
  generating a mark for a defined interesting event of a number of different interesting events in the long record length data, the mark having a start location, focus and duration with respect to the long record length data;
  displaying, on a display screen of said test and measurement instrument, a waveform indicative of a portion of the long record length data in a zoom display together with the mark, the mark having indicia including the duration;
  repeating the generating step for each occurrence of the defined interesting event in the long record length data to generate a plurality of marks, each having a starting location, focus and duration with respect to the long record length data; and,
  using said marks to gate measurements of said interesting event of said long record length data.

2. The method as recited in claim 1 wherein the displaying step comprises the steps of:
   selecting one of the plurality of marks; and
   displaying the portion of the long record length data in the zoom display together with the selected mark.

3. The method as recited in claim 1 further comprising the step of generating an annotation for the mark, the annotation being displayed with the indicia.

4. The method as recited in claim 3 wherein the annotation comprises measurement results associated with the duration of the mark.

5. The method as recited in claim 3 wherein the annotation comprises text identifying the specified feature of interest associated with the duration of the mark.

6. The method as recited in claim 1 further comprising the step of combining the marks to generate new marks according to further specified criteria.

7. The method as recited in claim 1 further comprising the step of filtering the marks to refine the marks for display according to further specified criteria.

8. The method as recited in claim 1 further comprising the step of storing the mark.

9. The method as recited in claim 8 further comprising the step of storing source data from the long record length data associated with the duration of the mark.

10. The method as recited in claim 1 further comprising the steps of:
    associating a mathematical formulation with the mark; and
    generating a measurement result according to the mathematical formulation from the portion of the long record length data associated with the duration of the mark.

11. The method as recited in claim 10 further comprising the step of displaying the measurement result together with the mark as an annotation.

12. The method as recited in claim 11 wherein the annotation includes a text string defining the mathematical result.

13. The method as recited in claim 3 wherein the annotation comprises an alphanumeric value representing a decoded symbol for the portion of the long record length data encompassed by the duration of the mark.

14. The method as recited in claim 3 wherein the annotation comprises a text string that defines the mark.

15. The method as recited in claim 3 wherein the annotation comprises compliance criteria associated with the mark.

* * * * *